United States Patent [19]

Iwai et al.

[11] Patent Number: 5,047,983

[45] Date of Patent: Sep. 10, 1991

[54] SEMICONDUCTOR STORAGE DEVICE WITH REDUNDANCY ARRANGEMENT

[75] Inventors: Hidetoshi Iwai, Fucyu; Kazuyuki Miyazawa, Kodaira, both of Japan

[73] Assignee: Hitachi, Ltd., Tokyo, Japan

[21] Appl. No.: 586,399

[22] Filed: Sep. 20, 1990

Related U.S. Application Data

[63] Continuation of Ser. No. 767,630, Aug. 20, 1985.

[30] Foreign Application Priority Data

Sep. 26, 1984 [JP] Japan .................................. 59-199556

[51] Int. Cl.$^5$ ........................ G11C 7/00; G11C 11/413
[52] U.S. Cl. .................... 365/200; 365/230.06; 365/230.08; 371/10.3
[58] Field of Search ...................... 365/189.01, 230.01, 365/230.06, 230.08, 189.07; 371/10.3

[56] References Cited

U.S. PATENT DOCUMENTS

| 4,104,735 | 8/1978 | Hoffmann et al. | 365/230 |
| 4,247,921 | 1/1981 | Itoh et al. | 365/233 |
| 4,532,607 | 7/1985 | Uchida | 371/10 X |
| 4,538,245 | 8/1985 | Smarandoiu et al. | 365/200 |

FOREIGN PATENT DOCUMENTS

| 0029322 | 5/1981 | European Pat. Off. |
| 0095721 | 12/1983 | European Pat. Off. |
| 0124900 | 11/1984 | European Pat. Off. |
| 2237671 | 3/1973 | Fed. Rep. of Germany |
| 3138363 | 8/1982 | Fed. Rep. of Germany |
| 57-198593 | 12/1982 | Japan |
| 1260914 | 1/1972 | United Kingdom |
| 1311997 | 3/1973 | United Kingdom |
| 1398438 | 6/1975 | United Kingdom |
| 2129585A | 5/1984 | United Kingdom |

OTHER PUBLICATIONS

IBM-TDB, vol. 19, No. 1, Jun. 1976, by Huffman et al. "Memory Address Decode Circiuit", pp. 28-29.

Primary Examiner—Alyssa H. Bowler
Attorney, Agent, or Firm—Antonelli, Terry, Stout & Kraus

[57] ABSTRACT

In a semiconductor storage device having a spare memory, an input address signal is checked by an address comparator circuit. When the input address signal indicates an address which is to be relieved, the spare memory is selected instead of a memory array on the basis of the output of the address comparator circuit at that time. In conventional system, the access time of the semiconductor memory is restricted substantially by the operating time of the address comparator circuit during this operation. Accordingly, for enabling a quick access of the semiconductor memory, an address signal to be supplied to the address comparator circuit is output from a proceeding stage circuit of a plurality of amplification stages which form an address buffer circuit.

13 Claims, 6 Drawing Sheets

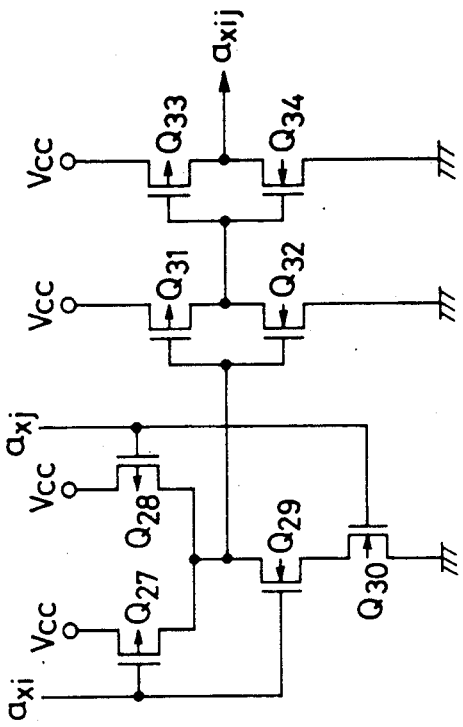
FIG. 6
FIG. 8
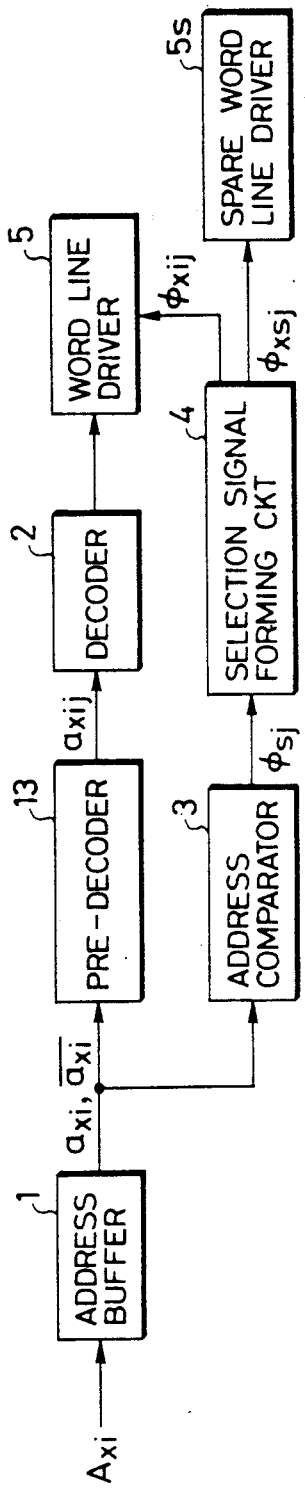
FIG. 7

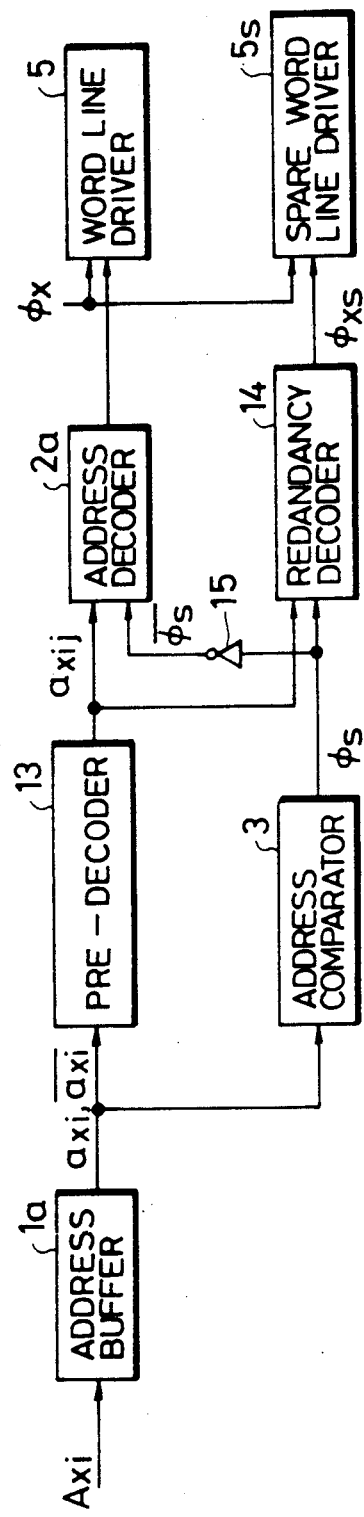

SEMICONDUCTOR STORAGE DEVICE WITH REDUNDANCY ARRANGEMENT

This application is a continuation of application Ser. No. 767,630, filed on Aug. 20, 1985, now abandoned.

BACKGROUND OF THE INVENTION

This invention relates to a technique applicable to the technology of semiconductor integrated circuits and semiconductor storage devices, and more particularly relates to a technique for a semiconductor storage device which is provided, for instance, with spare memory columns or memory rows and a redundancy circuit.

In a semiconductor storage device such as RAM (Random Access Memory), the reduction of yield due to a defective bit or the occurrence of a defective word line such as a disconnection or short circuit thereof becomes more likely as the capacity of the memory array increases. In order to improve this yield, it has been proposed to provide a redundancy circuit which can cope successfully with the defective bit and the defective word line by substituting a spare memory column or memory row prepared separately for the defective word line in a memory array.

The present inventors have developed, as one system of such a redundancy circuit construction, a system in which a means for setting an address of a memory column or a memory row containing the defective bit (hereinafter called defective address) and an address comparator circuit comparing the defective address set in said means with an input address are provided. A spare memory column or memory row is selected in place of the regular memory column or memory row when the aforesaid two addresses coincide with each other.

FIG. 1 shows a schematic construction of this system.

In the figure, numeral 1 denotes an address buffer which forms internal address signals axi and $\overline{axi}$ based on an address signal Axi input from external equipment to an address decoder which decodes internal address signals axi and $\overline{axi}$ supplied from the address buffer 1. Numeral 3 denotes an address comparator circuit having a defective address setting means therein. This circuit compares the internal address signals axi and $\overline{axi}$ supplied from the address buffer 1 with a defective address set beforehand in the defective address setting means, and delivers a coincide signal $\phi sj$ when said address signals and the defective address coincide completely with one another. A selection signal forming circuit 4 delivers a redundancy selection signal $\phi xsj$ for selecting a spare memory row, when said coincidence signal $\phi sj$ is supplied thereto. At that time, a selection signal $\phi xij$ is not output. A word line driver 5s, which is made to correspond to the spare memory row to be substituted for the memory row of the defective address, is driven by the redundancy selection signal $\phi xsj$. As the result, a word line of the spare memory row is selected.

When the coincidence of the addresses is not detected, the signal $\phi xsj$ is not output. In this case, the selection signal $\phi xij$ is output from a selection signal forming circuit 4. At this time, a word line driver 5 selected by the decoder 2 is driven. As the result, a regular word line is selected.

In the redundancy circuit of such an address comparison system as described above, an operation of comparing addresses is executed axi'internal address signals axi, $\overline{axi}$ supplied from the address buffer 1 not only when a spare memory row is selected, but also when a regular memory row is selected. This causes a problem in that access time is delayed by a time period required for the comparison of addresses.

SUMMARY OF THE INVENTION axi'

An object of this invention is to shorten an access time in a semiconductor storage device provided with a redundancy circuit.

The aforesaid object and other objects of this invention and new characteristic features thereof will be apparent from the description of the present specification and the drawings annexed thereto.

The typical features of a representative embodiment of the invention disclosed in the present application will be summarized in the following.

An output of the address buffer is connected with a relatively heavy load comprised of a relatively long connecting wiring line and an address decoder. Therefore the address buffer is designed so that the load driving ability of the final stage thereof is large. In contrast therewith, the internal address signals supplied to the address comparator circuit can be formed by a circuit which does not require so large a driving ability. Taking this fact into account, the present invention attains the aforesaid object of increasing the memory speed by a system wherein an address signal to be supplied to the address comparator circuit is output from a preceeding stage of the address buffer comprised with a multi-stage amplifier circuit. Thus, the output timing of a discrimination signal output from an address comparator circuit is expedited.

BRIEF DESCRIPTION OF THE DRAWINGS

FIG. 6 is a circuit diagram showing one example of an address decoder;

FIG. 7 shows a block structure of the principal part of a second embodiment of the present invention;

FIG. 8 is a circuit diagram showing one example of a pre-decoder;

FIG. 9 shows a block structure of the principal part of a third embodiment of the present invention.

PREFERRED EMBODIMENTS

(Embodiment 1)

Figure 2:
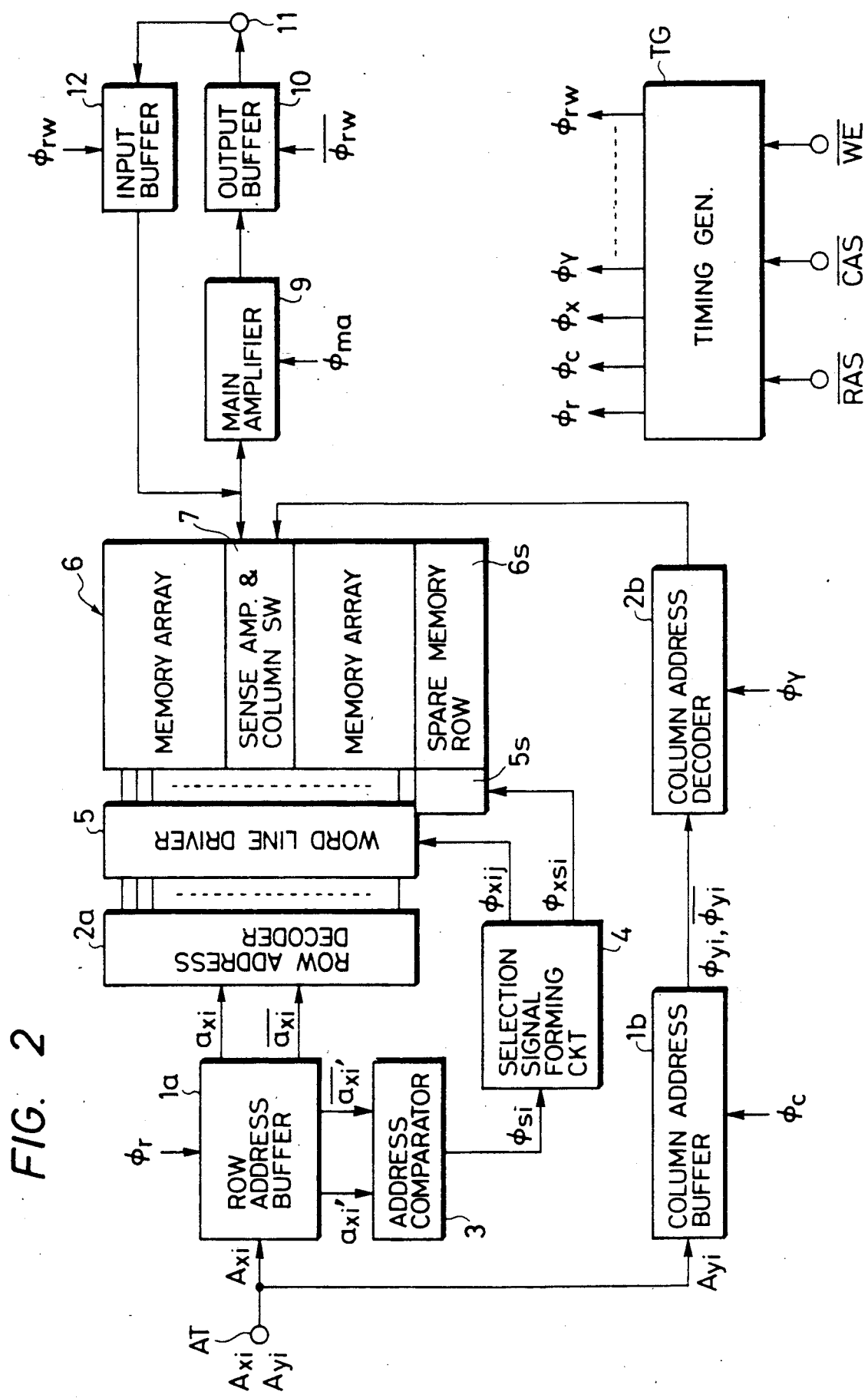
FIG. 2 is a block diagram showing one embodiment of the present invention applied to a dynamic RAM provided with the redundancy circuit.

FIG. 2 shows a first embodiment of the present invention which is applied to a peripheral CMOS type dynamic RAM.

In this figure, symbols 1a and 1b denote a row address buffer and a column address buffer which receive address signals Axi and Ayi supplied in a multiplex system from external equipment, and form internal complementary address signals axi, $\overline{axi}$, and ayi, $\overline{ayi}$, respectively. Numerals 2a and 2b denote a row address decoder and a column address decoder which are provided, respectively, for receiving the internal complementary address signals axi, $\overline{axi}$, and ayi, $\overline{ayi}$ supplied from said row address buffer 1a and column address buffer 1b and forming a word line selection signal and a data line selection signal, respectively.

Word line selection signals formed by the row address decoder 2a are supplied to a word line driver 5, and thereby a word line driver made to correspond to the address Axi is selected and enabled to be driven. Data line selection signals formed by the column address decoder 2b are supplied to a column switch 7 provided for each data line in a memory array 6.

The memory array 6 is constituted by the well-known one MOS type memory cells each of which is formed of a storage capacitor and an address selecting MOSFET (insulated gate field effect transistor), not shown in detail in the figure, and is arranged in a matrix. A sense amplifier, a data line precharging circuit, which is not shown in the figure, and said column switch 7 are provided for each data line in this memory array 6.

In reading data, each data line of the memory array 6 is set to a precharge level by the precharging circuit not shown in the figure. In other words, each data line is given a reference potential which is required for the operation of the sense amplifier 7. Next, with a word line selected, the data in a memory cell are given to each data line. The data given to the data line are amplified by the operation of the sense amplifier 7. A data signal of the data line amplified by the sense amplifier is supplied to a main amplifier 9 through the column switch 7 which is turned on by the selection signal delivered from the column address decoder 2b. The data read from the memory array 6 are amplified by the main amplifier 9 and delivered to an input/output terminal 11 through an output buffer 10. In writing, data supplied to the input/output terminal 11 are taken in by an input buffer 12 and written in a memory cell in the memory array 6 selected by the address decoder 2a and 2b.

On one side of said memory array 6, spare memory rows 6s are provided. Although one spare memory row 6s may also serve the purpose, a plurality of these rows are provided in this embodiment.

The spare memory rows 6s are regarded as forming substantially a part of the memory array 6. Each word line of the spare memory row 6s, which is not shown in the figure, is separated from each word line of the memory array 6, while each data line of the spare memory row 6s is made common with each data line of the memory array 6.

Numeral 3 denotes an address comparator circuit, which is provided therein with a defective address storing means which can store an address of a defective word line having a defect such as a defective bit or a disconnection. This circuit compares an address signal input from the outside with an address signal stored inside and detects whether the input address coincides with the defective address or not. The address storing means incorporated in this address comparator circuit 3 has the same construction as a known address storing means which is provided with a program element such as a fuse and designed so that the defective address can be set by disconnecting said program element or varying the resistance value thereof. Moreover, this address comparator circuit 3 is constructed so that the input address is compared bit by bit with the defective address, and when all the bits coincide with the bits of the set defective address, a low level discrimination signal $\phi$sj is delivered therefrom.

Figure 3:
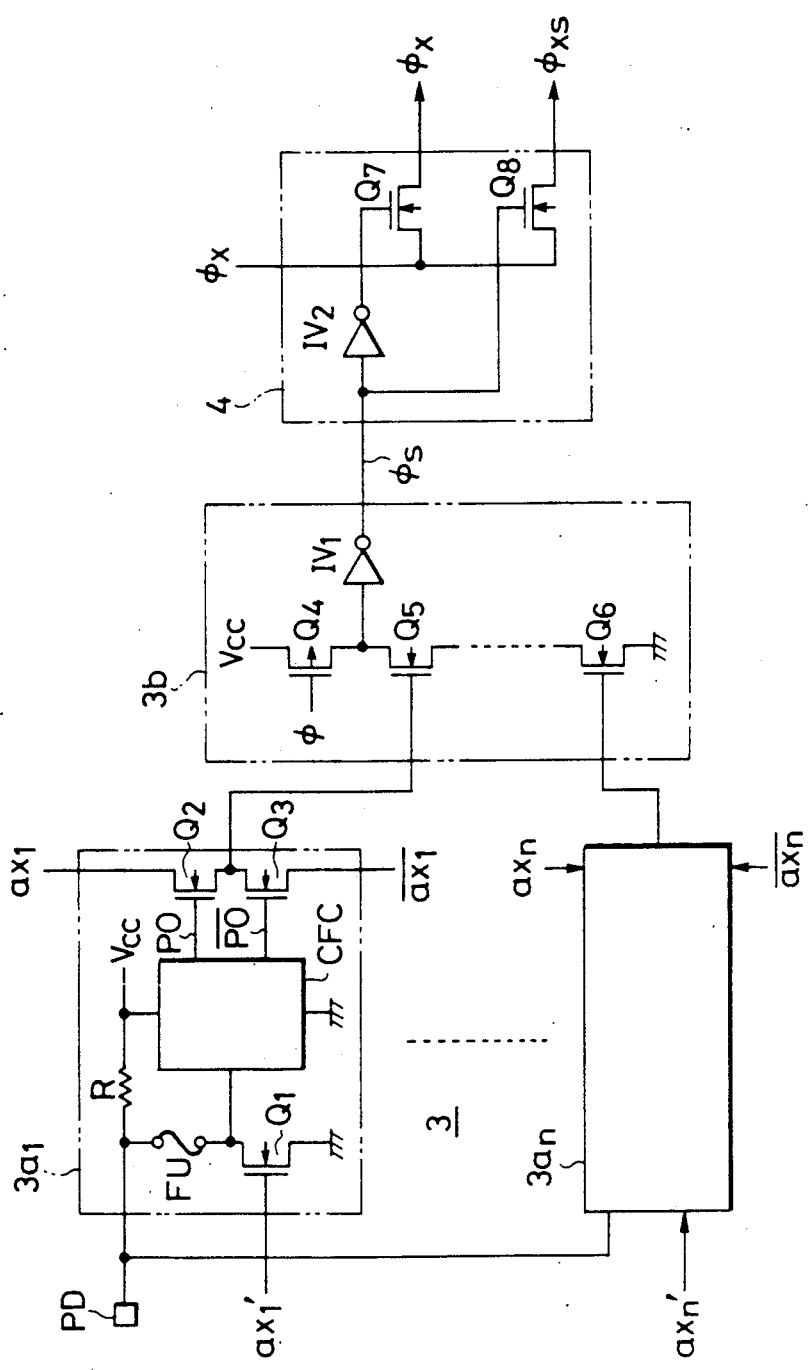
FIG. 3 is a circuit diagram of an address comparator circuit.

In FIG. 3, a concrete example of the address comparator circuit 3 is shown together with an example of a selection signal forming circuit 4, which will be described later.

The address comparator circuit 3 is comprised of address signal selection circuits $3_{a1}$ to $3_{an}$ and a decoder circuit 3b.

The address signal selection circuit $3_{a1}$ comprises, for instance, a fuse element FU formed of a polysilicon layer and serving as a program element, MOSFET $Q_1$ for programming, a resistance element R, a complementary signal forming circuit CFC, and address signal selecting MOSFETs $Q_2$ and $Q_3$. The programming of the fuse element FU is conducted in such a manner that a voltage virtually equal to a source voltage $V_{cc}$ is impressed on a common program terminal PD while an address signal is impressed on the gate of MOSFET $Q_1$. The complementary signal forming circuit CFC outputs complementary signals PO, $\overline{PO}$ corresponding to the state of disconnection of the fuse element FU. The complementary signals PO and $\overline{PO}$ put one of MOSFETs $Q_2$ and $Q_3$ in ON state and the other in the OFF state. One of the complementary address signals $ax_1$ or $\overline{ax_1}$ is selected by these MOSFETs $Q_2$ and $Q_3$. When the fuse element FU is disconnected, for instance, the signal PO goes high, and MOSFET $Q_2$ goes ON. Thereby the selection circuit $3_{a1}$ selects the address signal $ax_1$. The address signal selection circuit $3_{an}$ has the same construction as the above circuit.

The outputs of the address signal selection circuits $3_{a1}$ to $3_{an}$ all go high if address signals $ax_1$, $\overline{ax_1}$ to $ax_n$, $\overline{ax_n}$ indicate addresses to be relieved, and at least one of them goes low level if this is not the case.

The decoder circuit 3b comprises a precharge MOSFET $Q_4$, input MOSFETs $Q_5$ to $Q_6$ which form a NAND circuit substantially, and a CMOS inverter circuit $IV_1$, as shown in the figure. The output $\phi$s of the decoder circuit 3b goes high when the address signals $ax_1$, $\overline{ax_1}$ to $ax_n$, $\overline{ax_n}$ indicate addresses to be relieved, since all of the input MOSFETs $Q_5$ to $Q_6$ go ON in response thereto. In contrast, said output $\phi$s goes low when said address signals do not indicate said address, since at least one of MOSFETs $Q_5$ to $Q_6$ goes OFF.

According to this embodiment, the aforesaid address comparator circuit 3 is supplied with complementary address signals axi' and axi' formed by the level conversion of the address signal Axi and taken out of the preceeding stage of said buffer 1a rather than with the output of the final stage of the row address buffer 1a. The address comparator circuit 3 performs the comparison with a defective address on the basis of said complementary address signals axi' and axi'.

Figure 4:
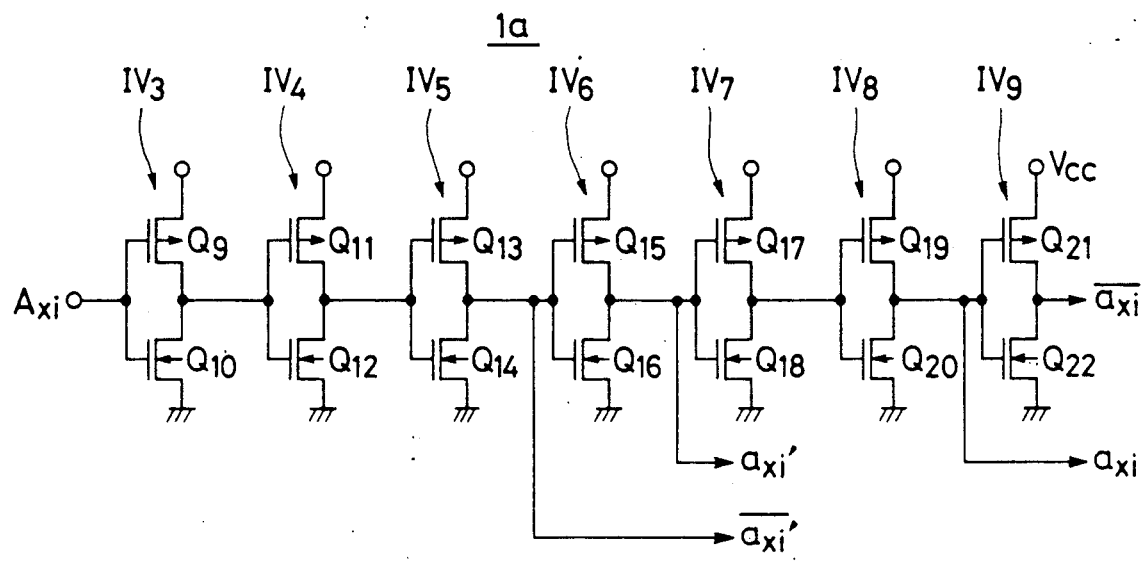
FIG. 4 is a circuit diagram showing one example of a structure of an address buffer.

The address buffer 1a in this embodiment comprises a plurality of CMOSA inverters $IV_1 \sim IV_7$ connected in cascade, as shown in FIG. 4, although the invention is not limited to this configuration.

Such a cascade connection of a plurality of circuits has been adopted for the following reasons.

The row address decoder 2a shown in FIG. 2 comprises a plurality of unit decoder circuits such as those each composed of a NAND circuit and an inverter circuit as a buffer circuit receiving an output from the former, though the detail thereof is not shown in the figure. Each unit decoder circuit decodes the address signals axi, $\overline{axi}$ of plural bits supplied from the row address buffer 1a, and delivers a decode signal based thereon. The number of the unit decoder circuits is made proportional to the number of word lines of the memory array 6, and thus it is increased with an increase in the capacity of the memory array 6. In accordance with this increase, the number of the unit decoder circuits to be driven by the row address buffer 1a is increased. Even when the output of one unit decoder circuit is distributed to four word lines by the word line driver 5 for the purpose of reducing the number of the unit decoder circuit, for instance, a large number of unit decoder circuits, such as 128, are needed if the number of the word lines of the memory array 6 is 512.

Each unit decoder circuit is provided, at its gate, with a plurality of input MOSFETs receiving address signals, though they are not shown in the figure since the circuit itself is not related directly to the present invention. Each input MOSFET has a gate capacitance which is not negligible. Accordingly, a large capacitance constructed with the gate capacitance of numerous input MOSFETs is connected to the output line of the row address buffer. In addition, since the memory array 6 formed on a semiconductor chip has a relatively large size and each unit decoder circuit in the row address decoder 2a is disposed corresponding to a word line, the wiring line for supplying the address signal to each unit decoder circuit is very long. This results in a very long output wiring for the row address buffer 1a. Such a long wiring line naturally has a large stray capacitance.

Therefore, the row address buffer 1a necessitates having a considerable driving capacity so that it can sufficiently drive a very high capacitance load formed by the aforesaid gate capacitance and wiring capacitance.

MOSFETs $Q_{21}$ and $Q_{22}$ which form an inverter circuit $IV_9$ working as the final stage of the buffer in FIG. 4 necessitate having a sufficiently low ON resistance for making the speed of variation of an address signal high enough in spite of the aforesaid heavy load. Accordingly, the respective channel width and size of MOSFETs $Q_{21}$ and $Q_{22}$ are enlarged. In other words, MOSFETs $Q_{21}$ and $Q_{22}$ are made larger.

In this connection, an inverter circuit $IV_6$ is made to have, disadvantageously, large input capacitance proportional to the driving capacity thereof.

An inverter circuit $IV_3$, which is made to operate as a level-discriminating circuit and a wave form shaping circuit, is designed to have a relatively small capacitance so as not to restrict the speed of variation of the address signal Axi which is an input signal thereto. In other words, MOSFETs $Q_9$ and $Q_{10}$, which form the inverter circuit $IV_3$, are small. Consequently, the inverter circuit $IV_3$ has only a relatively low driving capacity.

If inverter circuits $IV_4$ to $IV_7$ are omitted from a circuit arrangement of FIG. 4 so as to make the inverter circuit $IV_3$ drive an inverter circuit $IV_8$ directly, the speed of variation of an output signal of the inverter circuit $IV_3$ is restricted to a high degree by a large input capacity of the inverter circuit $IV_8$. As the result, it becomes difficult to obtain address signals axi and $\overline{axi}$ which can respond at high speed to the address signal Axi.

Thus, the inverter circuits $IV_4$ to $IV_7$ are provided so that a signal having a high response speed to the input signal Axi can be applied to the inverter circuit $IV_8$ even when the driving capacity of the inverter circuit $IV_3$ is relatively small.

The inverter circuit $IV_7$ is constructed so that it can drive the inverter circuit $IV_8$ sufficiently and that it forms a relatively light load on the inverter circuit $IV_6$ positioned in the stage before it.

The inverter circuit $IV_6$ is constructed so that it can sufficiently drive the inverter circuit $IV_7$ positioned in the stage behind it and that it forms a relatively light load on the inverter circuit $IV_5$ positioned in the stage before it.

The inverter circuits $IV_5$ and $IV_4$ are constructed in the same way as the above.

The P-channel MOSFET $Q_{21}$, which is a component of an inverter circuit $IV_9$ working as an output buffer, is formed to have such large sizes as a channel width of 150 $\mu$m and a channel length of 2 $\mu$m (hereinafter represented as 150/2), and the N-channel MOSFET $Q_{22}$ is also formed to have such large sizes as 75/2, although the invention is not limited to this configuration. MOSFETs $Q_{19}$ and $Q_{20}$ constituting the inverter circuit $IV_8$ are required to be able to drive the inverter circuit $IV_9$ as well as the decoder circuit, and therefore they are designed to have larger sizes than MOSFETs $Q_{21}$ and $Q_{22}$. Thus, the size of MOSFETs $Q_{19}$ and $Q_{20}$ is 200/2 and 100/2, respectively. MOSFETs $Q_{17}$ and $Q_{18}$ forming the inverter circuit $IV_7$ are 80/2 and 40/2 respectively. MOSFETs $Q_{15}$ and $Q_{16}$ forming the inverter circuit $IV_6$ are 100/2 and 50/2 respectively, and MOSFETs $Q_{13}$ and $Q_{14}$ forming the inverter circuit $IV_5$ are 150/2 and 75/2 respectively. MOSFETs $Q_9$ and $Q_{10}$ constituting the inverter circuit $IV_3$ are 20/2 and 50/2, respectively, so as to enable the input of an address signal Axi of TTL (Transistor Transistor Logic) level, for instance. MOSFETs $Q_{11}$ and $Q_{12}$ forming the inverter circuit $IV_4$ are 50/2 and 25/2, respectively.

By providing a plurality of inverter circuits having driving capacity substantially increased in sequence, in this way, the response speed of the address buffer circuit 1a to signals is improved.

Figure 1:
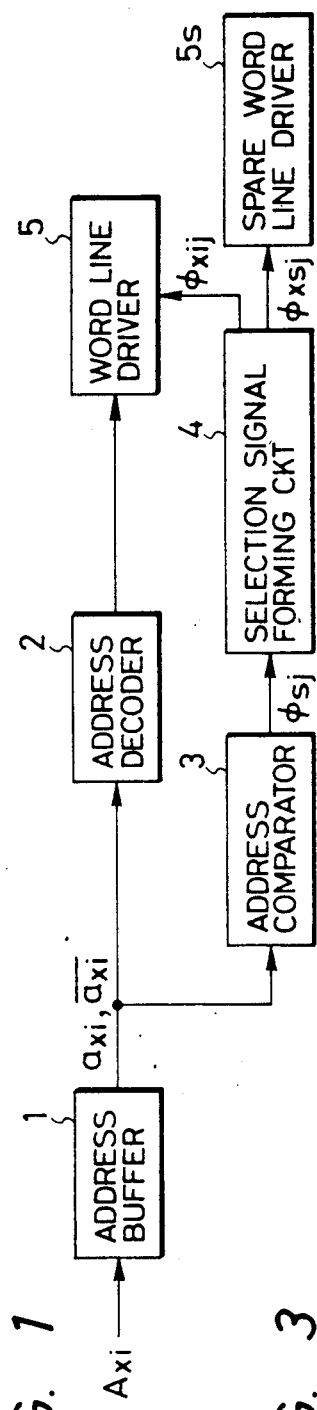
FIG. 1 is a block diagram showing one example of a structure of an access system of a semiconductor storage device provided with a redundancy circuit.

The outputs of the inverters $IV_8$ and $IV_9$ of the above-described CMOS inverters $IV_3$ to $IV_9$, which have the largest driving capacity, are supplied as internal complementary address signals axi and $\overline{axi}$ to the aforesaid row address decoder 2a. As for the address comparator circuit 3 shown in FIG. 1, on the other hand, the outputs of the inverters $IV_5$ and $IV_6$, which form the preceeding stage of the row address buffer 1a, are supplied thereto respectively as complementary address signals axi' and $\overline{axi'}$.

Figure 5:
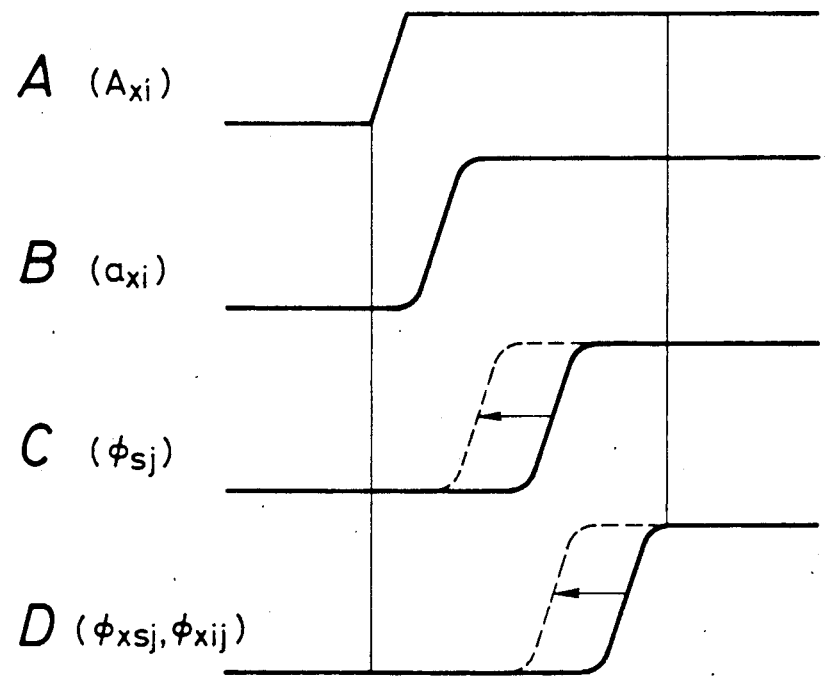
FIGS. 5A, 5B, 5C and 5D are timing charts showing the timings of a discrimination signal and a word line selection signal output from an address comparator circuit.

Here, in the above-described circuit arrangement, the row address decoder 2a is connected to the respective outputs of the inverters $IV_8$ and $IV_9$ forming the final stage of the row address buffer 1a through a relatively long wiring line as described above; therefore, these inverters require relatively large driving capacity. In contrast thereto, the address comparator circuit does not require the output of a circuit having large driving capacity, such as the inverters $IV_8$ and $IV_9$, because the circuit 3 itself forms a relatively light load. Accordingly, as described above, the outputs of the inverters $IV_5$ and $IV_6$ forming the preceeding stage of the row address buffer 1a may be supplied to the address comparator circuit 3. Although the inverters $IV_5$ and $IV_6$ have less driving power than the inverters $IV_8$ and $IV_9$, the delay time of the respective outputs from the address signal Axi is small. Accordingly, as is shown by the broken line in FIG. 5C, the variation in the discrimination signal $\phi sj$ is accelerated and the deliveries of selection signals $\phi xsj$ and $\phi xij$ are also accelerated as shown by a broken line of FIG. 5D, compared with the case in which the outputs axi and $\overline{axi}$ of the inverters IV$_8$ and IV$_9$ are employed as input signals for the address comparator circuit 3. When the selection signal $\phi xsj$ is output, the word line driver 5 selected by the decoder 2a at that time is driven. When the selection signal $\phi xij$ is output, the spare word line driver 5s is driven, and a spare memory row is thereby selected. Since the timing of the deliveries of the signals $\phi sj$ and $\phi xij$ is accelerator described above, according to this embodiment, the selection of the spare memory row is also performed at high speed. As the result, the access time of the memory is shortened.

While a spare memory row 6s is provided in parallel to a word line so as to be substituted for a memory row containing a defective bit in the above-described embodiment, a spare memory column and a sense amplifier may also be provided in parallel to a data line so that the spare memory column can be substituted for a data line containing the defective bit etc. Otherwise, the spare memory column may be provided together with the spare memory row.

In the above embodiment, in addition, adequate internal control signals are formed on the basis of a $\overline{RAS}$ (Row Address Strobe) signal and a $\overline{CAS}$ (Column Address Strobe) signal, which are supplied from the external equipment, and the address buffers 1a and 1b are operated by these internal control signals so as to take in the signals Axi and Ayi which are input by a multiplex system and to set the timing of the selection signals $\phi xij$ and $\phi xsj$ which are output from a selection signal forming circuit 4.

(EMBODIMENT 2)

Next, a second embodiment of the present invention will be described with reference to FIGS. 6 to 8.

A dynamic RAM in this embodiment is formed by the same CMOS integrated circuit technique as in the first embodiment.

In a peripheral CMOS type dynamic RAM of this embodiment, a decoder circuit is formed of a dynamic circuit for reducing the number of circuit elements, as shown in FIG. 6, for instance. Concretely, the decoder circuit is composed of N-channel MOSFETs Q$_{24}$, Q$_{25}$, Q$_{26}$, ... which are connected in series and on the respective gates of which internal address signals axi, ($\overline{axi}$) are impressed, and a precharging P-channel MOSFET Q$_{23}$ on the gate of which a timing signal $\phi$ is impressed. In this construction, the outputs of a plurality of decoder circuits are set to precharge level (virtually a level of a source voltage V$_{cc}$) by said timing signal $\phi$. Since every input axi ($\overline{axi}$) is high after a precharging operation has been effected by the timing signal $\phi$, only the output of the decoder circuit to be selected is low. Therefore consumed power is much less in this embodiment than in an NMOS type decoder.

When said CMOS type decoder is employed, however, the speed of extracting the charge of an output node is slowed down since the N-channel type MOSFETs Q$_{24}$, Q$_{25}$,... are connected in series, and as the result, access time may be prolonged.

In this embodiment, therefore, a pre-decoder 13 is provided in front of the address decoder 2, as shown in FIG. 7, so as to decode a pair of internal address signals axi, axj ($\overline{axi}$, $\overline{axj}$) in advance, and a signal axij thus obtained is used as an input signal for the main decoder 2. By this arrangement, the number of input terminals for the main decoder 2 is halved, and thereby the number of MOSFETs connected in series is reduced. Therefore, the fall of the output of the decoder can be expedited.

The aforesaid pre-decoder 13 is constructed, for instance, as shown in FIG. 8.

In this embodiment, internal complementary address signals axi, $\overline{axi}$ output from the address buffer 1 are employed as input signals for the address comparator circuit 3 in place of the output axij of the predecoder 13. In consequence, the timing of variation in the discrimination signal $\phi sj$ delivered from the address comparator circuit 3 is accelerated, compared with the case in which the output axij of the pre-decoder 13 is employed as the input signal, and thereby the access time is shortened.

(EMBODIMENT 3)

Figure 10:
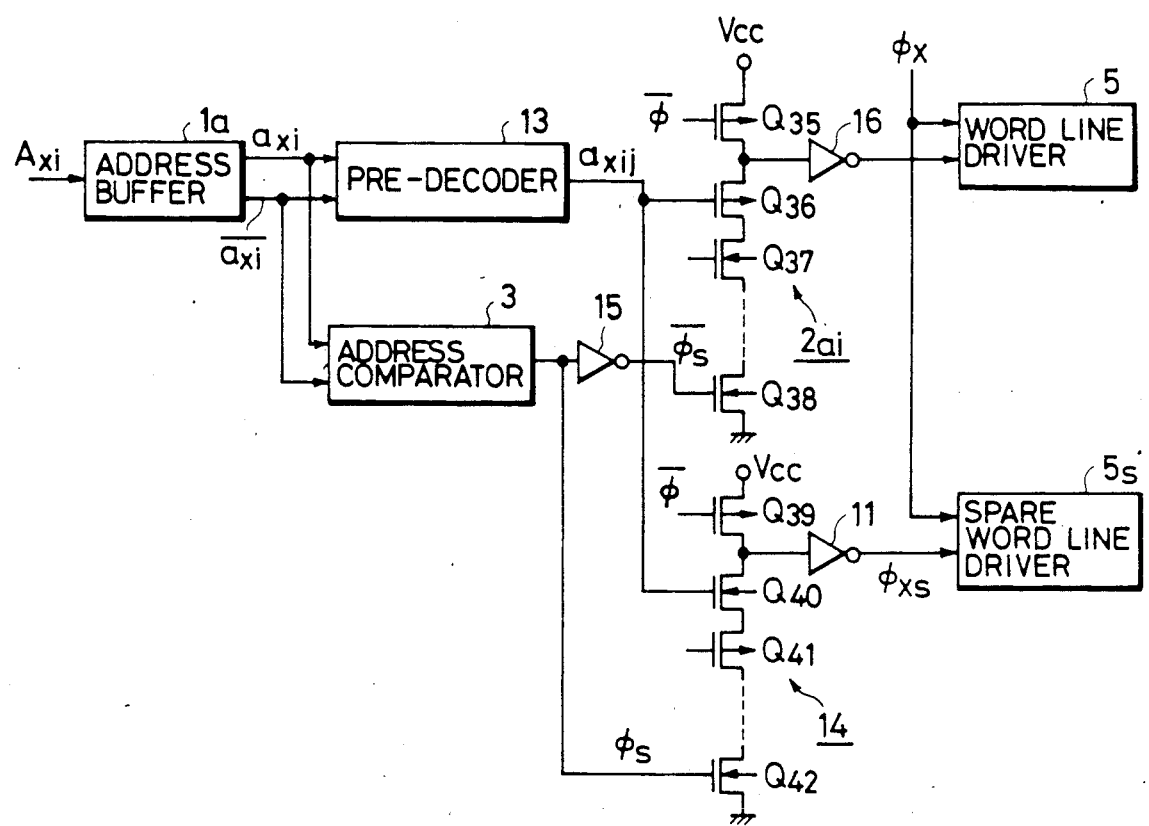
FIG. 10 shows a circuit structure of a concrete example thereof.

FIGS. 9 and 10 show a third embodiment of the present invention.

A dynamic RAM in this embodiment is provided with a plurality of spare memory rows. These spare memory rows in plural are selected by a redundancy decoder 14.

In this embodiment, the pre-decoder 13 is provided in the same way as in the above-described second embodiment. The outputs axi, $\overline{axi}$ of the address buffer 1a are used as input signals for a pre-decoder 13 and a address comparator circuit 3. A discrimination signal $\phi s$ output from the address comparator circuit 3 is supplied, together with the signal axij from the pre-decoder 13, to the redundancy decoder 14 provided for selecting one of a plurality of spare memory rows. Based on the output of this redundancy decoder 14, a spare word line driver 5s driving the word line of the spare memory row is selected.

A signal $\overline{\phi s}$ obtained by inverting the discrimination signal $\phi s$ by an inverter 15 is supplied to each regular address decoder 2a. Thereby every decoder output is forced to go high when the decision signal $\phi s$ is at a high level. In other words, the regular word line driver 5 is not selected.

Each address decoder 2ai and the redundancy decoder 14 have a series circuit comprising MOSFETs. Q$_{36}$, Q$_{37}$, ... and Q$_{40}$, Q$_{41}$, ... on which the output axij from the pre-decoder 13 is impressed, and MOSFETs Q$_{35}$ and Q$_{39}$ on which the decision signal $\phi s$ or the inverted signal $\overline{\phi s}$ thereof output from the address comparator circuit 3 is impressed, as shown in FIG. 10.

When the output (decision signal) $\phi s$ of the address comparator circuit 3 goes high due to the coincidence of the input address Axi with a set defective address, the redundancy decoder 14 forms a selection signal $\phi xs$ and the spare word line driver 5s is thereby selected. Then the spare word line driver 5s is driven by a driving signal $\phi x$ to select a spare memory row (6s).

When the discrimination signal $\phi s$ goes high, MOSFET Q$_{38}$ provided in the regular address decoder 2$_{ai}$ goes off. Consequently the output of every decoder 2ai remains high so that the regular word line driver 5 is not selected.

When an input address does not coincide with a defective address, that is, when the discrimination signal $\phi s$ goes low, the redundancy decoder 14 is not operated, while a regular decoder 2ai is activated. At this time a selection signal is output from one decoder 2ai which corresponds to an output aij from the precoder 13. Based on this selection signal, the regular word line 5 is selected, and the word line driver 5 is operated by the driving signal φs to set one word line at a selection level.

In this embodiment as well as in the preceding two embodiments, the formation of the discrimination signal is accelerated and the access time is therefore shortened, compared with the case in which the output of the predecoder 13 is employed as an input signal for the address comparator circuit 3.

With the present invention, the following effects can be attained.

(1) In a RAM provided with a redundancy circuit comprising a defective address setting means an address comparator circuit, etc., the address comparator circuit is supplied with an output taken out of the preceding stage of an address buffer formed of a plurality of stages. This construction enables the acceleration of the output timing of the discrimination signal delivered from the address comparator circuit, bringing forth the effects that the raise of a selection signal is accelerated, the access time is shortened, and reading is performed at high speed.

(2) In a RAM in which a pre-decoder is provided in front of the address decoder, and, in addition, a redundancy circuit is provided, the address comparator circuit is supplied with an output of an address buffer provided in the stage before the pre-decoder. This construction enables the acceleration of the output timing of the decision signal delivered from the address comparator circuit, bringing forth the effects that the rise of a selection signal is accelerated, the access time is shortened, and reading is performed at high speed.

The present invention made by the present inventors, which is described above concretely on the basis of embodiments, is not limited, of course, to the above-described embodiments, but it can be modified variously within the scope of the following claims without departing from the gist thereof. While the application to a CMOS type dynamic RAM is shown in the above-described embodiments, the present invention is also applicable to a complete NMOS type dynamic RAM, for instance, on condition that the address buffer is formed of circuits in plural stages or that the pre-decoder is provided in front of the address decoder.

While the above decision is made on the examples in which the invention made by the present inventors is applied to the dynamic RAM which is the field of utilization being the background of the invention, the present invention is not limited to these examples and can be adapted to all the semiconductors storage devices, such as a static RAM, that are provided with a redundancy circuit.

We claim:

1. A semiconductor storage device comprises:
   a memory array;
   a first circuit receiving an input address signal;
   a second circuit made to respond to an output signal of said first circuit and forming an address signal to be supplied to an address decoder;
   said address decoder being coupled to said memory array, and decoding said address signal formed by said second circuit so as to form a selection signal to be supplied to said memory array;
   a spare memory;
   an address comparator circuit receiving an output signal of said first circuit, wherein said address comparator circuit includes store means for storing a defective address signal and means for comparing the defective address signal stored in said storage means with the output signal of said first circuit; and
   a selection signal forming circuit made to respond to an output signal of said address comparator circuit and forming a selection signal for said spare memory,
   wherein said first circuit is formed of an address buffer circuit, and
   further wherein said second circuit is formed of a pre-decoder decoding the address signal supplied from said address buffer circuit, and forming, based on this signal, a decoded signal to be supplied to said address decoder.

2. A semiconductor storage device according to claim 1 wherein further comprises:
   a word line driver receiving the selection signal output from said address decoder, and forming, based on this signal, a selection signal to be supplied to a word line in said memory array,
   said spare memory having a word line selected by the selection signal delivered from said selection signal forming circuit, and
   said selection signal forming circuit delivering a signal for stopping the operation of said word line driver and a signal for driving the work line in said spare memory, in response to the output signal of said address comparator circuit.

3. A semiconductor storage device according to claim 2,
   wherein each of said first and second circuits is formed of a plurality of inverter circuits.

4. A semiconductor storage device according to claim 3,
   wherein the inverter circuits forming said first and second circuits are formed of insulated gate field-effect transistors, and
   further wherein the insulated gate field-effect transistors for forming the output signal of said second circuit are made larger than the insulated gate field-effect transistors for forming the output signal of said first circuit.

5. A semiconductor storage device according to claim 4,
   wherein each of said inverter circuits is formed of a CMOS inverter circuit.

6. A semiconductor storage device comprising:
   a memory array including a plurality of memory cells;
   a first circuit receiving an input address signal;
   a second circuit coupled to said first circuit and forming an address signal in response to an output signal of said first circuit;
   an address decoder coupled to said second circuit and forming a selection signal by decoding the address signal of said second circuit;
   a word line driver coupled to said address decoder and to said memory array, and forming a selection signal to be supplied to a word line in said memory array;
   a spare memory including a plurality of memory cells;
   an address comparator circuit coupled to said first circuit and receiving an output signal of said first circuit and receiving an output signal of said first circuit, wherein said address comparator circuit includes store means for storing a defective address signal and comparator means for comparing the defective address signal stored in said store means with the output signal of said first circuit; and a selection signal forming circuit responsive to an output signal of said comparator means for forming a selection signal for said spare memory, wherein said first circuit includes an address buffer circuit, and wherein said second circuit includes a pre-decoder for decoding an address signal supplied from said address buffer circuit, so as to form the address signal to be supplied to said address decoder.

7. A semiconductor storage device according to claim 6, wherein said spare memory includes a word line coupled to memory cells and supplied with the selection signal delivered from said selection signal forming circuit, and wherein said selection signal forming circuit delivers a signal for stopping the operation of said word line driver and a signal for driving the word line in said spare memory, in response to the output signal of said comparator means.

8. A semiconductor storage device according to claim 7, wherein each of said first and second circuits is formed of a plurality of inverter circuits.

9. A semiconductor storage device according to claim 8, wherein the inverter circuits forming said first and second circuits are formed of insulated gate field-effect transistors, and wherein the insulated gate field-effect transistors for forming the output signal of said second circuit are made larger than the insulated gate field-effect transistors for forming the output signal of said first circuit.

10. A semiconductor storage device according to claim 9, wherein each of said inverter circuits is formed of a CMOS inverter circuit.

11. A semiconductor storage device according to claim 7, wherein each of said memory cells includes a storage capacitor and an address selecting MOSFET.

12. A semiconductor storage device according to claim 4, wherein said address buffer circuit is formed of a CMOS circuit.

13. A semiconductor storage device according to claim 12, wherein said CMOS circuit includes CMOS inverters.

* * * * *